United States Patent
Hashmi et al.

(10) Patent No.: US 10,184,969 B2
(45) Date of Patent: Jan. 22, 2019

(54) MONITORING SYSTEM FOR A CAPACITOR BANK

(71) Applicant: Cooper Technologies Company, Houston, TX (US)

(72) Inventors: Mohammad Umar Hashmi, Pune (IN); Michael Paul Nowak, Whitefish Bay, WI (US); Clay Lynwood Fellers, Little Mountain, SC (US); Karl Eric Fender, Fayetteville, GA (US); Santosh Kumar Sharma, Maharashtra (IN); Hassan Al-Atat, Algonquin, IL (US); Damian Antonio Gonzalez, Greenwood, SC (US); Nudurupati Naga Vasishta Pratap, Maharashtra (IN)

(73) Assignee: Eaton Intelligent Power Limited, Dublin (IE)

( * ) Notice: Subject to any disclaimer, the term of this patent is extended or adjusted under 35 U.S.C. 154(b) by 0 days.

(21) Appl. No.: 15/243,252

(22) Filed: Aug. 22, 2016

(65) Prior Publication Data

US 2017/0059639 A1 Mar. 2, 2017

Related U.S. Application Data

(60) Provisional application No. 62/208,867, filed on Aug. 24, 2015.

(51) Int. Cl.
*G01R 31/02* (2006.01)
*H02J 3/18* (2006.01)
(Continued)

(52) U.S. Cl.
CPC .......... *G01R 31/028* (2013.01); *G01R 31/44* (2013.01); *H02H 7/16* (2013.01); *H02J 3/18* (2013.01); *G01R 31/40* (2013.01); *Y02E 40/30* (2013.01)

(58) Field of Classification Search
None
See application file for complete search history.

(56) References Cited

U.S. PATENT DOCUMENTS 6,456,097 B1 9/2002 Sutherland
2008/0291593 A1* 11/2008 Day .................... H02H 7/06
361/78

(Continued)

FOREIGN PATENT DOCUMENTS

| JP | 2003217407 A | 7/2003 |
| KR | 20080019836 A | 3/2008 |
| KR | 20110045406 A | 5/2011 |

OTHER PUBLICATIONS

International Search Report and Written Opinion, counterpart PCT Application No. PCT/US2016/048023, dated Nov. 29, 2016, 12 pages total.

*Primary Examiner* — Jermele M Hollington
*Assistant Examiner* — Douglas X Rodriguez
(74) *Attorney, Agent, or Firm* — DiBerardino McGovern IP Group LLC

(57) ABSTRACT

A first electrical response of a capacitor bank is accessed, the capacitor bank including a plurality of capacitor units arranged in a fixed spatial relationship with each other, each capacitor unit having a nominal impedance; a test electrical signal is provided to the capacitor bank; a second electrical response of the capacitor bank is measured after providing the test electrical signal to the capacitor bank; the first electrical response of the capacitor bank and the second response of the capacitor bank are compared; and whether an impedance of one or more capacitor units in the capacitor bank has changed relative to the nominal impedance is determined based on the comparison.

27 Claims, 6 Drawing Sheets

(51) Int. Cl.
*H02H 7/16* (2006.01)
*G01R 31/44* (2006.01)
*G01R 31/40* (2014.01)

(56) References Cited

U.S. PATENT DOCUMENTS

2010/0013498 A1   1/2010  Olguin
2013/0030584 A1*  1/2013  Milosevic ............... H02J 3/18
                                              700/291
2013/0128393 A1*  5/2013  Gajic ..................... H02H 7/16
                                              361/15

* cited by examiner

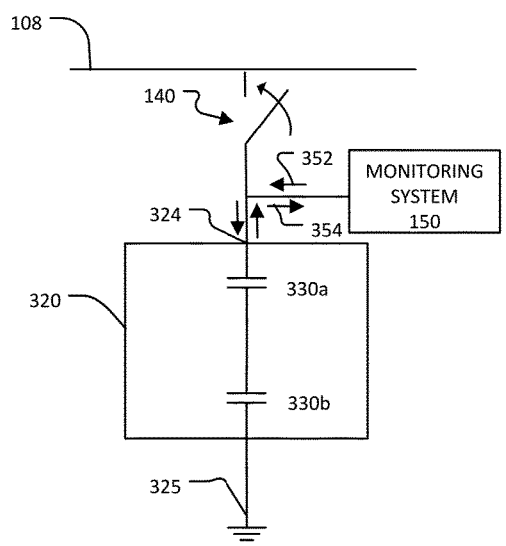
FIG. 3A
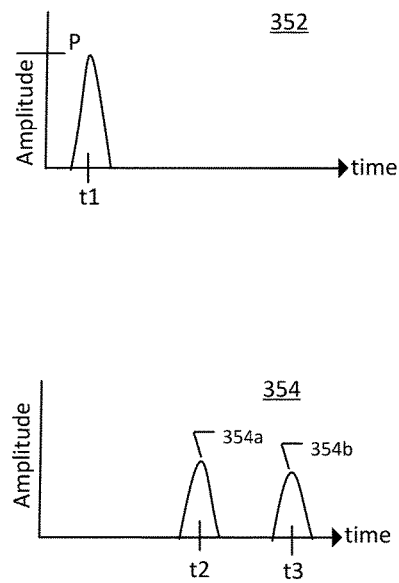
FIG. 4A
FIG. 4B
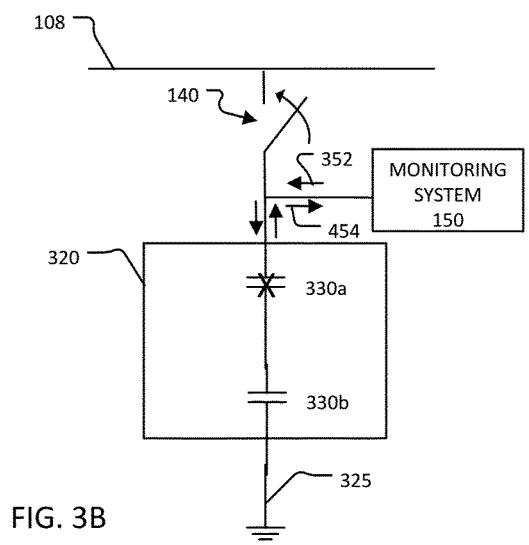
FIG. 3B
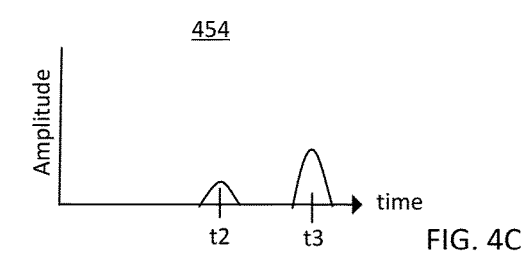
FIG. 4C
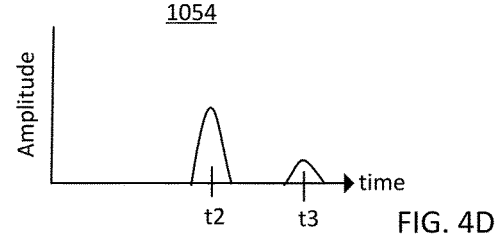
FIG. 4D

MONITORING SYSTEM FOR A CAPACITOR BANK

CROSS-REFERENCE TO RELATED APPLICATION

This application claims the benefit of U.S. Provisional Application No. 62/208,867, filed on Aug. 24, 2015 and titled MONITORING SYSTEM FOR A CAPACITOR BANK, which is incorporated herein by reference in its entirety.

TECHNICAL FIELD

This disclosure relates to a monitoring system for a capacitor bank.

BACKGROUND

A corrective device, such as a capacitor bank, may be connected to an electrical power system to improve power factor and voltage regulation.

SUMMARY

In one general aspect, a system includes a capacitor bank including a terminal and a plurality of capacitor units arranged in a predetermined and spatially fixed configuration relative to each other, each of the capacitor units including at least one capacitive element and having a nominal impedance; and a monitoring system electrically connected to the capacitor bank, the monitoring system including one or more electronic processors, and a non-transitory computer-readable medium coupled to the one or more electronic processors, the medium including instructions that, when executed, cause the one or more electronic processors to: access configuration data stored on the computer-readable medium, the configuration data including information that specifies the spatially fixed configuration of the plurality of capacitor units of the capacitor bank; access a first electrical response of the capacitor bank; provide a test electrical signal to the capacitor bank; measure a second electrical response of the capacitor bank after providing the test electrical signal to the capacitor bank; compare the first electrical response and the second electrical response; and identify, based on the comparison and the information that specifies the spatially fixed configuration of the plurality of capacitor units of the capacitor bank, a group of capacitor units within the capacitor bank that have an impedance that is different from the nominal impedance of the group of capacitor units, the identified group of capacitor units including fewer than all of the capacitor units in the capacitor bank.

Implementations may include one or more of the following features. The second electrical response of the capacitor bank may include an amplitude and phase of a reflection of the test electrical signal from all of the plurality of capacitor units of the capacitor bank as a function of time. The identified group of capacitor units may be a single one of the capacitor units.

The capacitor bank may be a fuseless capacitor bank. The capacitor bank may be an externally fused capacitor bank. The capacitor bank may be an internally fused capacitor bank.

The second electrical response of the capacitor bank may be an impedance of the capacitor bank as a function of frequency.

The capacitor bank may be a fuseless capacitor bank, the second electrical response of the capacitor bank may be an impedance of the capacitor bank as a function of frequency, and the identified group of capacitor units may include a string of capacitor units connected in series.

The second electrical response of the capacitor bank may be an impedance of the capacitor bank as a function of frequency, and the identified group of capacitor units may be a single one of the capacitor units.

The instructions to compare the first electrical response and the second electrical response may include instructions to subtract the first electrical response and the second electrical response to form an error signal. The instructions to identify a group of capacitor units within the capacitor bank may include instructions to cause the processor to analyze the error signal to extract one or more features, and instructions to provide the extracted one or more features to a classifier.

The instructions to identify a group of capacitor units within the capacitor bank may include instructions to cause the processor to analyze the second electrical response to extract one or more features, and instructions to provide the extracted one or more features to a classifier.

The monitoring system may also include instructions to cause the processor to: generate a modeled electrical response from an impedance-based model of the capacitor bank, the impedance-based model of the capacitor bank being based on the nominal values of the capacitor units and the configuration data; and store the modeled electrical response in the computer-readable medium, where the instructions to access the first electrical response of the capacitor bank include instructions to access the modeled electrical response, and the instructions to compare the first electrical response and the second electrical response include instructions to subtract the modeled electrical response and the second electrical response to form an error signal. The instructions also may cause the processor to adjust one or more parameters of the impedance-based model based model after forming the error signal and to generate a second modeled electrical response from the adjusted impedance-based model.

The system also may include a communications interface coupled to the monitoring system, the communications interface configured to provide an indication of the identified group of capacitors to a remote station.

In some implementations, the test electrical signal is provided to the capacitor bank through the terminal, and the second electrical response of the capacitor bank is measured at the terminal after providing the test electrical signal to the capacitor bank.

In another general aspect, a first electrical response of a capacitor bank is accessed, the capacitor bank including a plurality of capacitor units arranged in a fixed spatial relationship with each other, each capacitor unit having a nominal impedance; a test electrical signal is provided to the capacitor bank; a second electrical response of the capacitor bank is measured after providing the test electrical signal to the capacitor bank; the first electrical response of the capacitor bank and the second response of the capacitor bank are compared; and whether an impedance of one or more capacitor units in the capacitor bank has changed relative to the nominal impedance is determined based on the comparison.

Implementations may include one or more of the following features. The impedance of one or more capacitor units may be determined to have changed, and the one or more capacitor units within the capacitor bank that have a changed impedance may be identified.

Information that indicates a spatial arrangement of the capacitor units of the capacitor bank may be accessed, and identifying the one or more capacitor units within the capacitor bank may be based on the accessed information that indicates the spatial arrangement of the capacitor units.

The first electrical response may include an amplitude and phase of a reflection of a first electrical signal from the capacitor units of the capacitor bank as a function of time, and the second electrical response may include an amplitude and phase of a reflection of the test electrical signal from capacitor units of the capacitor bank as a function of time.

Comparing the first electrical response and the second electrical response may include determining an error response as a function of time, the error response including a difference between the first response and the second response, and determining whether the impedance of a capacitor unit has changed based on the comparison may include determining whether the impedance of a capacitor units has changed based on the determined error response. Determining whether the impedance of any of the capacitor units have changed based on the determined error response may include analyzing the error response to identify one or more features, and providing the features to a classifier.

The first electrical response of the capacitor bank may include impedance as a function of frequency and the second electrical response of the capacitor bank may include impedance as a function of frequency.

The capacitor bank may include a plurality of strings, each string including a plurality of capacitor units connected in series, and identifying the one or more capacitor units within the capacitor bank that have a changed impedance may include identifying a string from among the plurality of strings.

An indication of the identified one or more capacitor units may be provided to a remote monitoring station.

The test electrical signal may be provided to the capacitor bank at a terminal of the capacitor bank, and the second response of the capacitor bank may be measured at the terminal.

Accessing the first electrical response of the capacitor bank may include providing the first electrical signal to the capacitor bank and measuring the response of the capacitor bank to the first electrical signal.

In another general aspect, a monitoring system for a capacitor bank includes one or more electronic processors, and a non-transitory computer-readable medium coupled to the one or more electronic processors, the medium including instructions that, when executed, cause the one or more electronic processors to: access configuration data stored on the computer-readable medium, the configuration data including information that specifies a spatial configuration of capacitor units in the capacitor bank, the spatial configuration indicating a predetermined and spatially fixed arrangement of the capacitor units relative to each other and a nominal impedance of each capacitor unit; access a first electrical response of the capacitor bank; provide a test electrical signal to the capacitor bank; measure a second electrical response of the capacitor bank after providing the test electrical signal to the capacitor bank; compare the first electrical response and the second electrical response; and identify, based on the comparison and the information that specifies the spatially fixed configuration of the plurality of capacitor units of the capacitor bank, a group of capacitor units within the capacitor bank that have an impedance that is different from the nominal impedance of the group of capacitor units, the identified group of capacitor units including fewer than all of the capacitor units in the capacitor bank; and a communications interface configured to provide an indication of the identified capacitor units to a remote station that is separate from the monitoring system.

Implementations of any of the techniques described above may include an apparatus, a system, a capacitor bank, a monitoring system for a capacitor bank, and/or a method. The details of one or more implementations are set forth in the accompanying drawings and the description below. Other features will be apparent from the description and drawings, and from the claims.

DRAWING DESCRIPTION

FIGS. 3A and 3B are block diagrams of an exemplary capacitor bank and the monitoring system at two different times.

FIG. 4A is a plot of an exemplary input signal as a function of time that the monitoring system provides to the capacitor bank of FIGS. 3A and 3B.

FIG. 4B is an exemplary baseline time domain reflectometry (TDR) response of the capacitor bank of FIG. 3A.

FIG. 4C is an exemplary illustration of TDR response of the capacitor bank of FIG. 3B.

FIG. 4D is an exemplary error signal determined based on the TDR responses of FIGS. 4B and 4C.

DETAILED DESCRIPTION

Techniques for identifying particular failed or degraded capacitor units within a capacitor bank using a monitoring system are disclosed. To identify the failed or degraded capacitor units, the monitoring system analyzes a time domain reflectometry (TDR) response signal and/or an impedance frequency response of the capacitor bank. The monitoring system also may use and/or generate an impedance-based model of the capacitor bank. The monitoring system allows failed and/or degraded capacitor units to be identified from among the many (for example, hundreds) capacitor units in the capacitor bank from an electrical measurement that characterizes the overall condition of the entire capacitor bank.

Figure 1A:
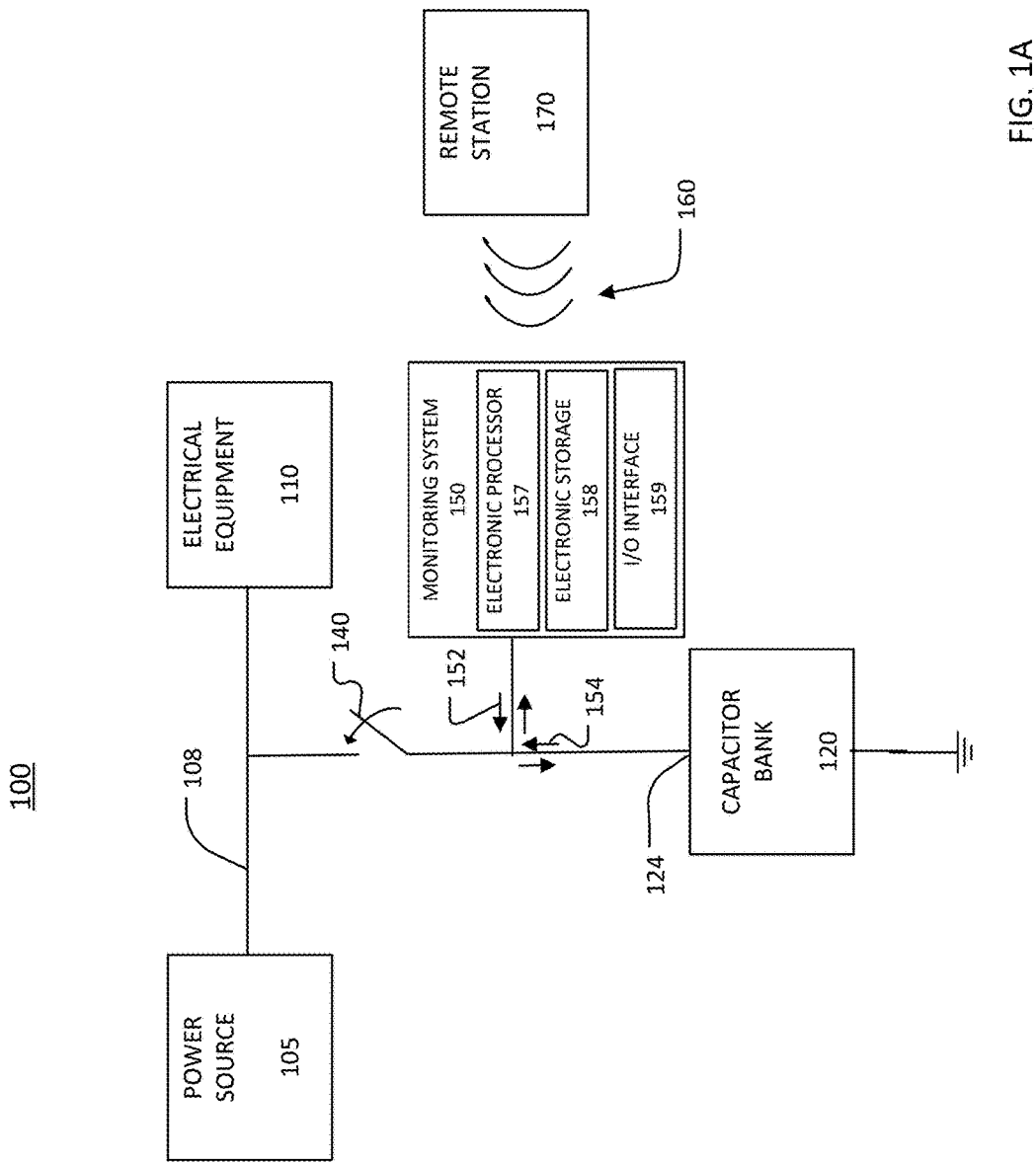
FIG. 1A is a block diagram of an electrical power system that includes an exemplary capacitor bank and a monitoring system.

Referring to FIG. 1A, a block diagram of an exemplary electrical power system 100 is shown. The power system 100 includes a capacitor bank 120 that is connected to a power line 108 in the power system 100 when a switch 140 is closed and is disconnected when the switch 140 is open. When connected to the power system 100, the capacitor bank 120 improves the performance of the power system 100 by, for example, increasing the power factor. The power factor is a ratio of real power (delivered to the load, measured in watts) to apparent power (measured in volt-amperes). The power factor provides an indication of how efficiently electricity is being used within the power system 100. When the capacitor bank 120 is disconnected from the power system 100 (for example, when there is unacceptable degradation within the bank 120), the system power factor decreases and additional electricity must be supplied to the power system 100 to maintain the same real power delivered to the load, resulting in higher generation and transmission costs.

Thus, increasing the portion of time that the capacitor bank 120 is connected to the power system 100 may result in an overall improvement in the performance of the system 100. The monitoring system 150 allows for rapid identification of failed and/or degraded capacitor units within the capacitor bank 120, reducing the amount of time that the capacitor bank 120 is disconnected from the power system 100. In this manner, the monitoring system 150 may improve the performance of the power system 100.

The power system 100 includes a power source 105 that provides electricity to electrical equipment 110 through the power line 108. The power system 100 may be, for example, an electrical grid, and electrical system, or a multi-phase electrical network that provides electricity to commercial and/or residential customers. The power system 100 may have an operating voltage of, for example, at least 1 kilovolts (kV) or an operating voltage of 69 kV or higher. The power system 100 may operate at a fundamental frequency of, for example, 50-60 Hertz (Hz). The electrical equipment 110 may be any commercial or residential electrical equipment that receives electricity from the power source 105 or electrical equipment that transfers or distributes electricity in the power system 100. For example, the electrical equipment 110 may include transformers, reclosers, or equipment that is in a manufacturing facility.

Figure 1B:
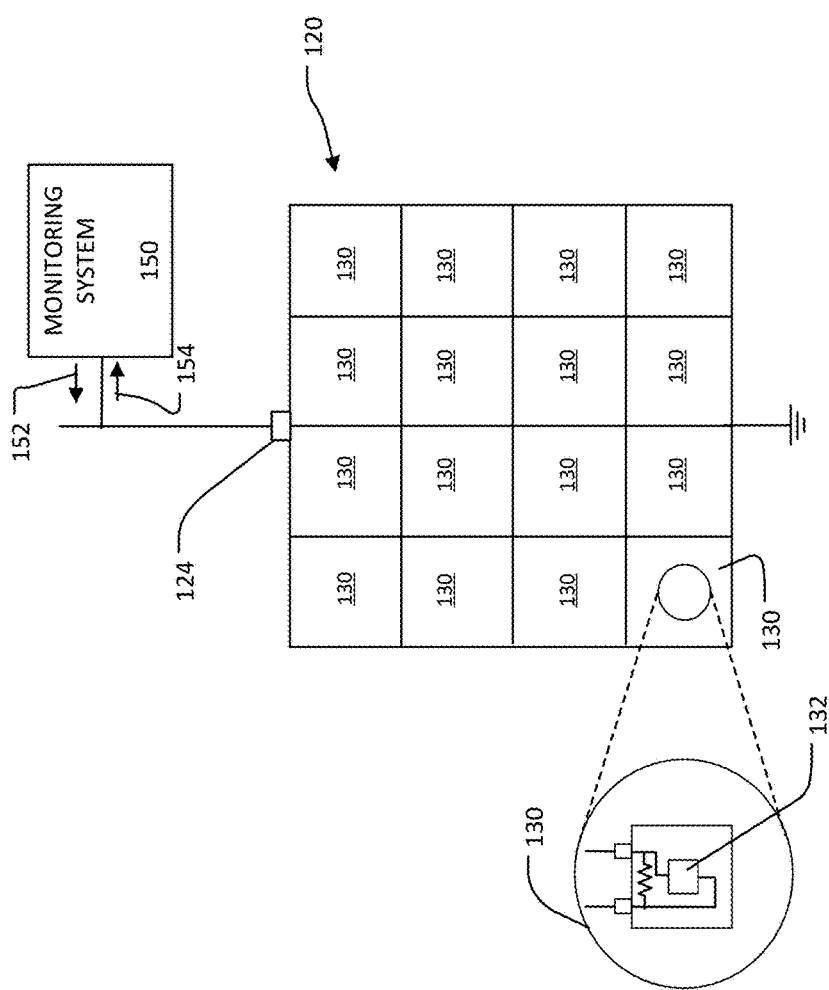
FIG. 1B is a block diagram of the capacitor bank of FIG. 1A.

Referring also to FIG. 1B, the capacitor bank 120 includes a plurality of capacitor units 130, each of which includes at least one capacitive element 132. The capacitive element 132 may be any electrical component that stores an electrical charge, such as a capacitor. In examples in which the capacitor unit includes more than one capacitive element 132, the capacitive elements 132 may be connected in series or in parallel, or in a configuration that includes both series and parallel connections.

Figure 2:
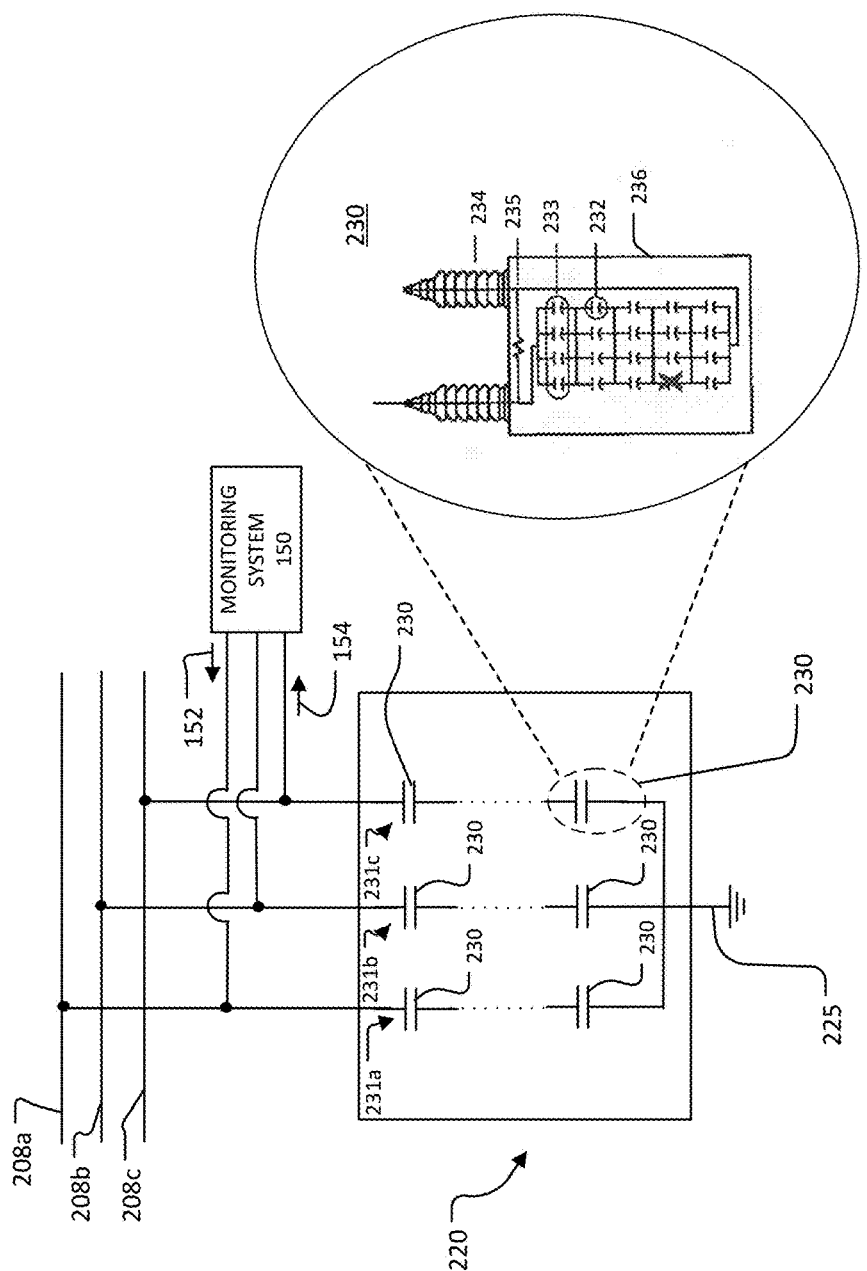
FIG. 2 is a block diagram of an exemplary capacitor bank and the monitoring system.

The capacitor bank 120 includes a large number (for example, hundreds or thousands) of capacitor units 130 that are arranged in a fixed spatial relationship to each other. The fixed spatial relationship may be referred to as the geometry of the capacitor bank 120. The capacitor units 130 may be connected in series or in parallel, or in a configuration that includes both parallel and series connections. The capacitor bank 120 may be grounded or ungrounded. The capacitor units 130 may be arranged such that the capacitor bank 120 is in a grounded wye, ungrounded wye, or delta configuration. The capacitor bank 120 may be a fuseless capacitor bank, an internally fused capacitor bank, or an externally fused capacitor bank. The monitoring system 150 may be used with a single-phase or multi-phase capacitor bank. For example, the monitoring system 150 may be used with a three-phase fuseless capacitor bank (such as shown in FIG. 2) or a two-phase capacitor bank.

The monitoring system 150 is electrically coupled to the capacitor bank 120. The monitoring system 150 identifies individual capacitor units and/or groups of one or more capacitor units that have failed and/or are degraded by identifying capacitor units that have a change in impedance. When fully operational and performing as expected, the capacitor units 130 have a nominal, baseline, or rated impedance (any of which may be considered a "healthy" impedance). The capacitor units 130 can degrade over time and/or fail due to, for example, material impurities, variations in the manufacturing process, environmental effects, usage, and/or aging. A failed capacitor unit is one that has an impedance that has changed by a percentage of the rated (or healthy) impedance. A capacitor unit 130 may be considered to be a failed unit when the unit 130 has become a short circuit. A degraded capacitor unit is a unit 130 that includes failed capacitive elements 132 but has not yet failed to a complete short. For example, a capacitor unit 130 that is degraded can have one or more failed or shorted internal capacitive elements 132 but also has enough healthy capacitive elements 132 to allow the capacitor unit 130 to continue to operate safely. When a capacitive element inside of a capacitor unit fails, the impedance of the capacitive unit changes. The impedance of a degraded capacitor unit can continue to change in discrete increments as additional capacitive elements 132 within the capacitor unit 130 fail.

The failure or degradation of a capacitor unit may cause the voltage across the other capacitor units in the capacitor bank 120 to increase. If the capacitor bank 120 continues to operate under these conditions, the other capacitor units 130 in the capacitor bank 120 may degrade and/or fail, and such successive failures can lead to the failure of the entire capacitor bank 120. To prevent failure of the entire capacitor bank 120, failed or degraded capacitor units should be identified and replaced. However, manual inspection and/or testing of each of the individual capacitor units 130 in the capacitor bank 120 can be time consuming (for example, 1 to 2 days). Because such inspection of the individual capacitor units is performed while the capacitor bank is disconnected from the power system 100, the inspection also may result in diminished performance of the power system 100 for a relatively prolonged length of time.

The monitoring system 150 monitors the capacitor bank 120 and identifies or localizes failed capacitor units in the bank 120 without requiring manual inspection of the individual capacitor units 130. The monitoring system 150 provides an electrical input signal 152 to the capacitor bank 120 and receives an output signal 154, which is the electrical response of the entire capacitor bank 120. The monitoring system 150 analyzes the output signal 154 to identify individual capacitor units 130 or a group of capacitor units 130 in the capacitor bank 120 that have an impedance that has changed relative to the healthy impedance. Thus, the monitoring system 150 eliminates the need to inspect or test individual capacitor units 120 one-by-one. Thus, the monitoring system 150 may reduce downtime for the capacitor bank 120. Because the capacitor bank 120 improves the performance of the power system 100, the monitoring system 150 also improves the performance of the power system 100 by allowing the capacitor bank 120 to be connected to the power system 100 for a higher portion of the time.

Additionally, the monitoring system 150 may be used offline (when the capacitor bank 120 is disconnected from the power system with the switch 140 open) or online (when the capacitor bank 120 is connected to the power system 100 with the switch 140 closed). When used online, the monitoring system 150 may continuously assess the health and status of the capacitor bank 120 and the capacitor units 130 to determine whether the impedance of any of the capacitor units 130 is beginning to change.

When the impedance of any of the capacitor units 130 is beginning to change, the monitoring system 150 may estimate how much longer the unit 130 may be safely used and/or may monitor particular units over a period of time to determine how rapidly the change in impedance is occurring. This information regarding the expected amount of remaining use of the capacitor unit may be used to, for example, schedule a work crew, order replacement parts, and/or schedule a time to remove the capacitor bank 120 from service by disconnecting the bank 120 from the power line 108. In this manner, the monitoring system 150 may provide an advance indication of a possible worsening failure mode, which may allow the bank 120 to be removed from service at a convenient time prior to failure and when the maintenance work can be completed quickly and with minimal impact to the performance of the power system 100. For example, during nighttime, power usage may be lower and the power factor may be higher than is typically the case during the daytime. Thus, scheduling maintenance for the capacitor bank 120 during at night may minimize the impact of removing the bank 120 from service.

The monitoring system 150 may use time domain reflectometry (TDR) to identify particular failed or degraded capacitor units 130 from among the many capacitor units 130 in the capacitor bank 120. In these examples, the input signal 152 is a step or pulse of electrical energy, and the output signal 154 is a response of the capacitor bank 120 (and the capacitor units 130) to the input signal 152 as a function of time. An example of using TDR to identify failed and/or degraded capacitor units is discussed with respect to FIGS. 3A and 3B and 4A-4D. The TDR implementation may be used to identify failed or degraded capacitor units in a fuseless capacitor bank, an externally fused capacitor bank, or an internally fused capacitor bank.

In some implementations, such as discussed with respect to FIGS. 5A-5C and 6, the monitoring system 150 uses a frequency sweep to identify degraded or failed capacitor units. In implementations that employ the frequency sweep, the input signal 152 is, for example, a voltage signal that includes a plurality of frequencies, and the output signal 154 is a current signal that represents the impedance response of the capacitor bank 120 (and the capacitor units 130) as a function of frequency. In the example of FIGS. 5A-5C and 6, the identification of degraded or failed capacitor units or strings of capacitor units that include one or more failed or degraded capacitor units in a fuseless capacitor bank is discussed. A fuseless capacitor bank includes strings of capacitor units that are connected in series, and the strings are connected to other strings in parallel. However, the frequency sweep may be applied to identify degraded or failed capacitor units or groups of capacitor units in, for example, externally fused capacitor banks or internally fused capacitor banks that are configured in a different manner than a fuseless capacitor bank and do not include strings of capacitor units.

The TDR and frequency sweep approaches may be used together to identify particular failed or degraded capacitor units. Additionally, the monitoring system 150 may model the electrical properties of the capacitor bank 120 and use the model to determine if the capacitor bank 120 includes one or more failed or degraded capacitor units. In some implementations, one or more features are extracted from the output signal 154 and provided to a classifier (such as a statistical classifier or neural network) to identify degraded or failed units.

The monitoring system 150 may provide information that identifies the failed or degraded capacitor units through a communication path 160 to a remote station 170 (FIG. 1A). The communication path 160 may be a wireless path, a wired connection between the monitoring system 150 and the remote station 170, or a path that includes wired and wireless portions.

The monitoring system 150 also includes an electronic processor 157 and an electronic storage 158. The electronic storage 158 may be volatile memory, such as RAM. In some implementations, and the electronic storage 158 may include both non-volatile and volatile portions or components. The electronic processor 157 may be one or more processors suitable for the execution of a computer program such as a general or special purpose microprocessor, and any one or more processors of any kind of digital computer. Generally, a processor receives instructions and data from a read-only memory or a random access memory or both. The electronic processor 157 may be any type of electronic processor and may be more than one electronic processor.

The electronic storage 158 stores instructions, perhaps as a computer program, that, when executed, cause the electronic processor 157 to communicate with other components in the monitoring system 150, the power system 100, and/or the capacitor bank 120. Additionally, the electronic storage 158 stores configuration data that specifies information about the capacitor units 130. The configuration data may include the spatial arrangement of the capacitor units 130 relative to each other, the nominal impedance of each capacitor unit 130, the internal arrangement and components of each capacitor unit 130, and/or the type and length of wire or electrical cable between the capacitor units 130. The nominal impedance of the capacitor units 130 may be in terms of an RLC characterization that models the capacitor units with resistance (R), inductance (L), and capacitance (C) components, or with one or more of these attributes. The electronic storage 158 may also contain historic measurement data or classification parameters, for example, for fault localization on a day-to-day basis and for prognostic purposes.

The monitoring system 150 also includes an input/output (I/O) interface 159 that allows the monitoring system 150 to receive commands from, for example, a human operator or an automated process and to provide information to the communication path 160. The I/O interface 159 may include a display that is configured to visually present data regarding the identified failed or degraded capacitor units. The monitoring system 150 may also communicate with unbalance detection relays or equipment of the capacitor bank 120 for the purpose of timing the bank measurements and to develop greater confidence in decision making by sharing information.

FIG. 2 is a block diagram of the monitoring system 150 connected to another exemplary capacitor bank 220. The capacitor bank 220 is connected to power lines 208a, 208b, 208c, each of which carries a single phase of electricity from a power source. In the example of FIG. 2, the capacitor bank 220 is a three-phase fuseless capacitor bank that includes fuseless capacitor units 230 connected in three strings 231a, 231b, 231c. Each of the strings 231a, 231b, 231c include capacitor units 230 connected in series. The strings 231a, 231b, 231c are connected in parallel to each other, and the strings 231a, 231b, 231c are between the power lines 208a, 208b, 208c, respectively, and a neutral or ground 225. The monitoring system 150 may provide the input signal 152 to and receive the output signal 154 from each of the strings 231a, 231b, 231c. In some implementations, the monitoring system 150 monitors fewer than all of the phases, that is, the input signal 152 may be provided to and/or the output signal 154 may be received from any and fewer than all of the series strings 231a, 231b, 231c.

In this example, each capacitor unit 230 includes twenty capacitive elements 232, arranged in five series sections 233 (with each series section 233 including four capacitive elements 232 in parallel), bushings 234, a discharge resistor 235, and a housing 236 that encloses the capacitive elements 232 and the discharge resistor 235. The capacitor units 230 are connected to other capacitor units in series through the bushings 234. In the example shown, the left-most capacitive element 232 in the third series section 233 (marked with an "X") has failed, changing the impedance of the capacitor unit 230 as compared to the impedance when none of the capacitive elements 232 have failed. The information about the internal construction of the capacitor units 230 and their spatial arrangement relative to each other may be stored in the electronic storage 158 (FIG. 1A) of the monitoring system 150 as part of the configuration data. The information about the internal construction of the capacitor units 230 may be used to estimate the overall change in impedance of the capacitor unit when, for example, a capacitive element within the capacitor unit fails.

FIGS. 3A, 3B, and 4A-4D show an example of the monitoring system 150 using time domain reflectometry (TDR) to identify a failed or degraded capacitor unit within a capacitor bank 320. As discussed in the example below, given knowledge of the spatial arrangement of the capacitor units relative to each other (for example, the distance between the capacitor units), the peaks in the reflected TDR signal can be correlated with the known locations of the capacitor units to identify a failed or degraded capacitor unit within the capacitor bank. The spatial arrangement of the capacitor units relative to each other may be stored on the electronic storage 158 (FIG. 1A) as configuration data.

Referring to FIGS. 3A and 3B, the monitoring system 150 is connected to the exemplary capacitor bank 320. The capacitor bank 320 includes many (for example, hundreds) of capacitor units, two of which, capacitor units 330a and 330b, are shown for illustration. The capacitor units 330a and 330b are arranged in series between a terminal 324 of the capacitor bank 320 and ground 325. The capacitor units 330a and 330b are a known distance from each other and the terminal 324. The known distance may be included in the configuration data and stored in the electronic storage 158 of the monitoring system 150 along with additional information about the capacitor bank 320.

The monitoring system 150 produces an input signal 352, which is shown as amplitude as function of time in FIG. 4A. In this example, the input signal 352 is a voltage pulse that has an amplitude of zero except during a time centered on a time t1 when the amplitude of the pulse rises from zero to a peak amplitude P and then returns to zero.

To obtain a baseline TDR response 354 for the capacitor bank 320, the input signal 352 is provided to the capacitor bank 320 through the terminal 324 when the capacitor units 330a and 330b are healthy. For example, the baseline TDR response 354 may be obtained when the capacitor bank 320 is first deployed or assembled and stored in the electronic storage 158. The input signal 352 reflects from the capacitor units 330a and 330b to produce a reflected TDR signal, which is the baseline TDR response 354 and is shown in FIG. 4B.

The baseline TDR response 354 includes reflections from all of the capacitor units that are in the capacitor bank 320. In this manner, the baseline TDR response 354 may be considered to have components or contributions from all of the capacitor units of the capacitor bank 320, and the baseline TDR response 354 is an overall response of the capacitor bank 320 when all of the capacitor units in the capacitor bank 320 are healthy.

The baseline TDR response 354 includes a peak 354a caused by the input signal 352 reflecting from the capacitor unit 330a (which is closer to the terminal 324) that occurs at a time t2 and a peak 354b caused by the input signal 352 reflecting from the capacitor unit 330b (which is farther from the terminal 324) that occurs at a later time t3. The times t2 and t3 are relative times measured from the time when the input signal 352 is provided to the capacitor bank 320. The amplitude and phase of the reflection indicates the impedance of the capacitor units 330a and 330b, with a smaller amplitude indicating a lower impedance. The input signal 352 loses energy when reflected from the capacitor unit 330a, thus, the amplitude of the peak 354b may be less than the amplitude of the peak 354a even if the capacitor units 330a and 330b have the same healthy impedance. The baseline TDR signal 354 may be stored in the electronic storage 158 (FIG. 1A) for comparison to reflected TDR signals measured at later times.

Because degradation and failure of a capacitor unit results in a change in impedance of the unit, failed or degraded capacitor units can be identified by analyzing an error signal that is determined by comparing the baseline TDR response 354 to a reflected TDR signal obtained after the capacitor bank 320 has been in use. The error signal may be determined by subtracting the baseline TDR response 354 from the later-obtained reflected TDR signal. If the impedance of the capacitor units 330a and 330b has not changed, then the reflected TDR signal obtained at a later time is substantially the same as the baseline TDR response 354 and the error signal is zero. However, if the capacitor unit 330a and/or 330b have degraded or failed, then the error signal has non-zero values at the times t2 and t3.

FIG. 3B and FIGS. 4C and 4D show an example in which the capacitor units 330a and 330b have degraded. Referring to FIG. 3B, after the capacitor bank 320 has been in use, the monitoring system 150 provides the input signal 352 to the capacitor bank 320 to determine whether any of the capacitor units have degraded or failed. The input signal 352 is reflected from the capacitor units 330a and 330b as a reflected TDR signal 454, which is shown in FIG. 4C. The reflected TDR signal 454 includes non-zero values at times t2 and t3. An error signal 1054 (FIG. 4D) is determined by comparing the reflected TDR signal 454 to the baseline TDR response 354 (FIG. 4B).

In the example of FIGS. 3B and 4D, error signal 1054 is non-zero at times t2 and t3, with the magnitude of the error signal 1054 being larger at time t2 than at time t3. Thus, although the impedance of both of the capacitor units 330a and 330b have changed relative to their healthy impedance, the impedance of the capacitor unit 330a has changed more than the impedance of the capacitor unit 330b.

The error signal 1054 is analyzed by the monitoring system 150 to determine whether any of the capacitor units in the capacitor bank 320 have failed or degraded. The monitoring system 150 may analyze the error signal 1054 by extracting features from the error signal 1054 and/or from the reflected TDR signal 454 and supplying some or all of the features to a statistical classifier to identify which capacitor units have failed or degraded. The features of the error signal 1154 may include, for example, the magnitude and/or phase of the error signal at the times t2 and t3 (the times associated with reflections from the capacitor units 330a and 330b, respectively). Additional features may include the starting time and time duration of the energy pulses of the error signal at times close to t2 and t3. The features also may include the magnitude and/or phase of other salient features in the error signal that are specific to the spatial arrangement of the capacitor units within the capacitor bank. Statistical classifiers, such as Support Vector Machines or Neural Networks, are trained with lab, field and/or simulation data to indicate the location of capacitor unit degradation.

In the example of FIG. 4D, the magnitude of the error signal 1054 at the times t2 and t3 is used to determine whether either or both of the capacitor units 330a and 330b have degraded or if they have completely failed, with a larger magnitude indicating that the capacitor unit is likely to have completely failed. In the example of FIGS. 3B and 4D, the amplitude of the error signal 1054 at the times t2 and t3, respectively, may indicate that the capacitor unit 330a has failed and the capacitor unit 330b is degraded. The monitoring system 150 may provide this information to the remote station 170 (FIG. 1A) so that the capacitor unit 330a can be replaced or other action taken. The capacitor unit 330b also may be replaced, or, depending on the severity of the degradation, may remain in the capacitor bank 320 until further degradation occurs. A visual representation of the capacitor bank 320 with the identified unit 330a shown as failed or degraded may be presented on a display of the monitoring system 150.

In some implementations, the healthy values of the capacitor units of the capacitor bank are known. In these implementations, the baseline TDR response 354 may be estimated from an impedance-based model of the capacitor bank 320 instead of, or in addition to, being measured directly. The impedance-based model uses the known healthy or nominal values of the capacitor units and the configuration (spatial arrangement of the capacitor units relative to each other and the terminal 324) to estimate the amplitude and phase of the reflection from each capacitor unit in the bank. These estimated reflections may be used as the baseline TDR response 354 instead of a measured baseline TDR response. In this manner, when a modeled TDR response is used as the baseline response 354, one or more failed or degraded capacitor units in the capacitor bank 320 may be identified with only one measured TDR response.

Thus, the monitoring system 150 analyzes the reflected TDR signal 454, which is a single measurement that includes contributions or components from all of the capacitor units in the capacitor bank 320, to identify particular capacitor units that are degraded or have failed.

As discussed above, the capacitor bank 320 may include hundreds or thousands of capacitor units, two of which, capacitor units 330a and 330b, are shown in FIGS. 3A and 3B for illustration. The capacitor units of the capacitor bank 320 are electrically connected to each other, with each capacitor unit including an electrical connection through which current flows to the unit. These electrical connections may become poor over time or may be damaged during use of the bank 320, and the impedance of these connections may increase as a result. The increased impedance leads to heat generation when current flows through the connection to the capacitor unit, and the generated heat may lead to reduced performance of the capacitor unit associated with the electrical connection. The relative location of the electrical connections of the units in the bank 320 is known. Thus, in some implementations, a capacitor unit that has a poor electrical connection can also be identified.

In addition to changing the TDR response, failed or degraded capacitor units in a capacitor bank also may cause the impedance frequency response of the capacitor bank to change. FIGS. 5A-5C and 6 show an example of the monitoring system 150 using the impedance frequency response of an exemplary capacitor bank 520 to identify failed or degraded capacitor units within the bank 520 or strings of capacitor units that include one or more failed or degraded capacitor units. As discussed in the example below, given knowledge of the spatial arrangement of the capacitor units relative to each other and the healthy impedance values of the capacitor units in the bank, failed or degraded capacitor units or strings that include failing or failed capacitor units may be identified by analyzing the frequency response of the capacitor bank 520. In some implementations, an impedance model of the capacitor bank 520 is also used to identify failed or degraded capacitor units or strings that include one or more failed or degraded capacitor units. The capacitor bank 520 includes many capacitor units, with two strings, 534a and 534b, shown for illustration in FIGS. 5A-5C.

Figure 5A:
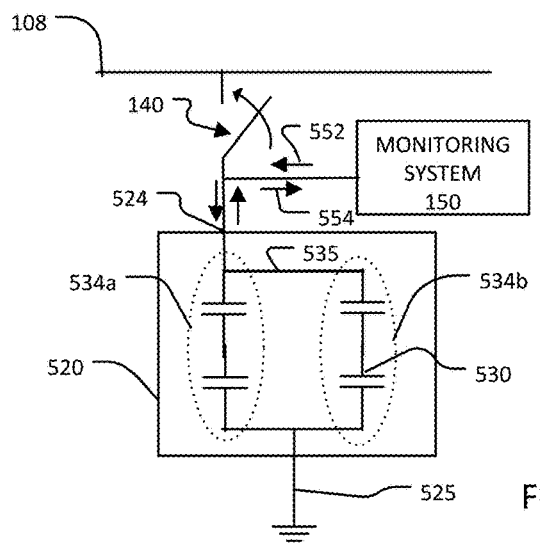
FIG. 5A-5C are block diagrams of an exemplary capacitor bank and the monitoring system at three different times.
Figure 5B:
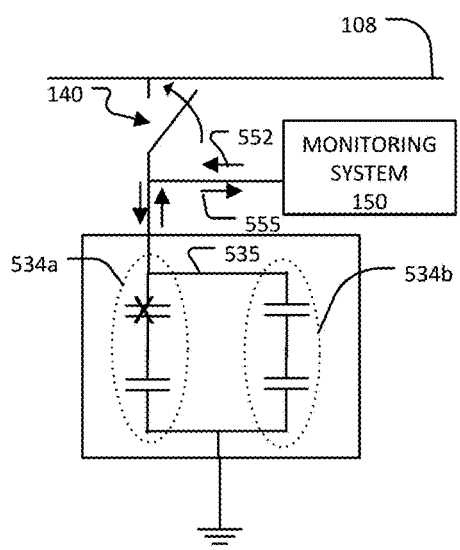
Figure 5C:
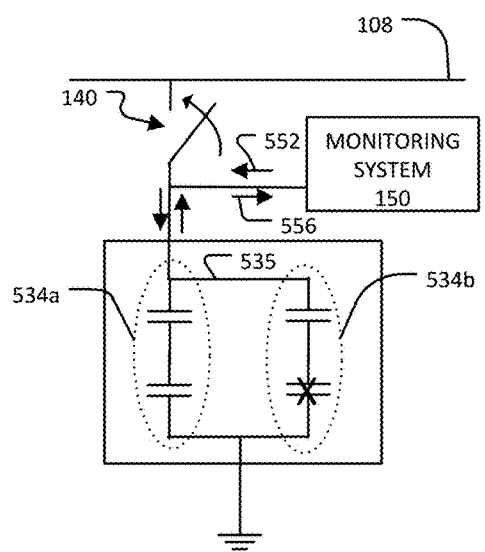

Referring to FIGS. 5A-5C, the capacitor bank 520 includes the two strings 534a and 534b of capacitor units 530. The strings 534a and 534b are connected in parallel between a terminal 524 of the capacitor bank 520 and ground 525. Each string 534a and 534b includes capacitor units 530 arranged in series. The monitoring system 150 is connected to the capacitor bank 520 through a terminal 524.

In FIG. 5A, all of the capacitor units 530 in the capacitor bank 520 are healthy. The monitoring system 150 provides an input signal 552, which may be, for example, a voltage signal having the same magnitude for a range of frequencies (for example, from 10 kHz to 100 kHz). A response 554 of the capacitor bank 520 to this input signal 552 indicates the impedance of the bank 520 as a function of frequency when all of the capacitor units 530 in the bank 520 are healthy. The healthy frequency response 554 of the bank 520 is received at the monitoring system 150 and may be stored in the electronic storage 158 (FIG. 1A) and compared against later-measured frequency responses.

After the capacitor bank 520 has been in use, one or more of the capacitor units 530 may fail or begin to degrade. FIG. 5B shows an example in which one of the capacitor units of the string 534a has failed, and FIG. 5C shows an example in which one of the capacitor units of the string 534b has failed. Referring to FIG. 5B, the monitoring system 150 again provides the input signal 552 to the capacitor bank 520 and measures a response 555 from the capacitor bank 520. The response 555 from the capacitor bank 520 indicates the impedance of the capacitor bank 520 as a function of frequency. FIG. 5C shows the monitoring system 150 providing the input signal 552 to the capacitor bank 520 and receiving a response 556.

Figure 6:
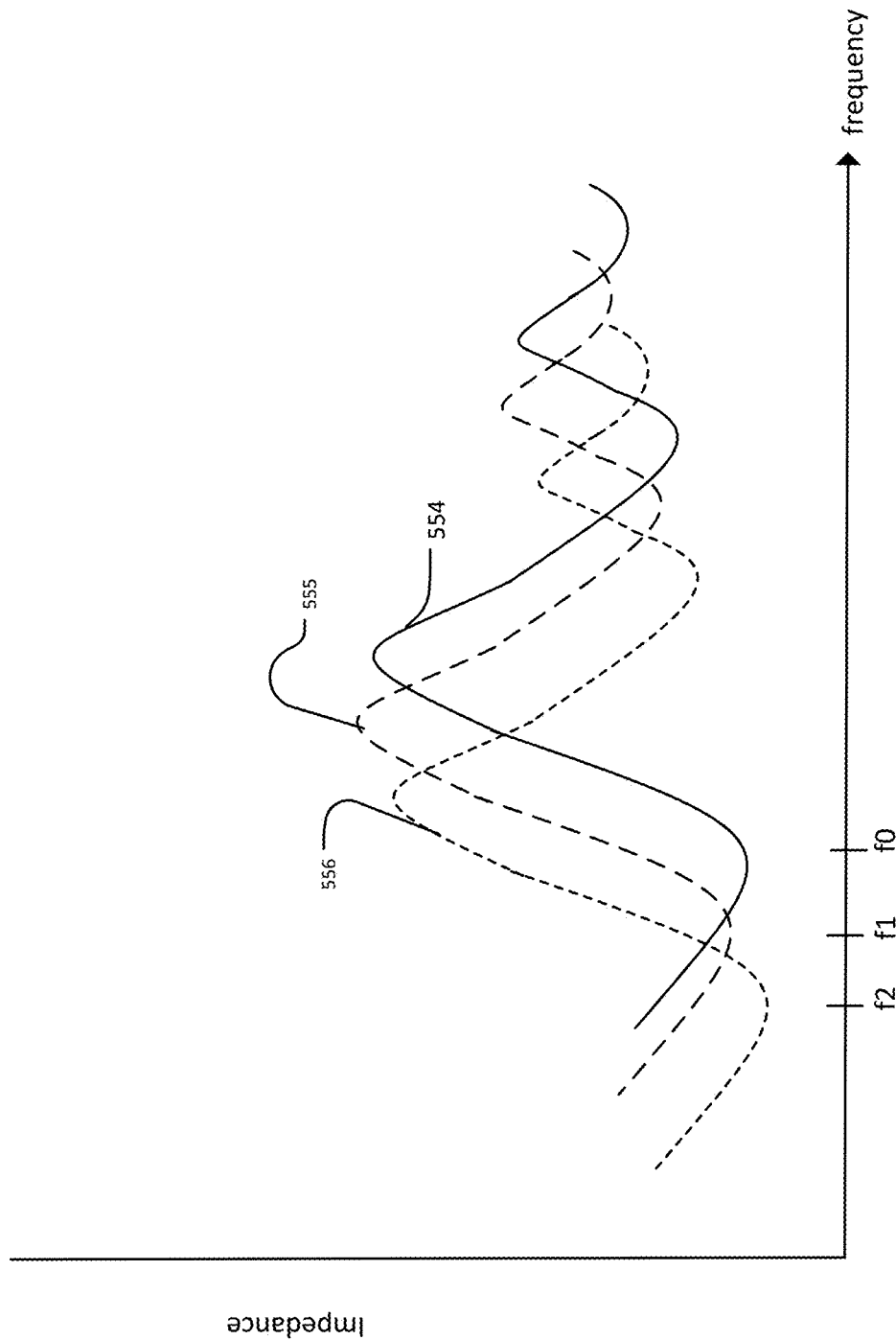
FIG. 6 shows plots of exemplary illustrations of impedance frequency responses of the capacitor banks of FIGS. 5A-5C.

Referring also to FIG. 6, which shows example illustrations of the impedance responses 554, 555, 556 of the capacitor bank 520 as a function of frequency, if one or more of the capacitor units 530 in a string of capacitor units fails or degrades, the frequency response of that capacitor unit or capacitor units change, and the impedance frequency response of the string that includes the degraded or failed capacitor unit or units and the capacitor bank 520 also changes. For example, the minimum impedance of a string with one or more failed capacitor units may occur at a lower frequency than the frequency at which the minimum impedance of the string with only healthy capacitor units. The minimum impedance of the healthy frequency response 554 of the bank 520 occurs at a frequency $f_0$. The minimum impedance of the response 555 (FIG. 5B) occurs at a frequency $f_1$, which is a lower frequency than the frequency $f_0$ at which the minimum impedance of the healthy frequency response 554 occurs. The minimum impedance of the response 556 (FIG. 5C) occurs at a frequency $f_2$, which is a lower frequency than the frequency $f_0$ and the frequency $f_1$.

By comparing the responses 555 and 556 to the healthy frequency response 554, the capacitor unit and/or the string that contains the failed or degraded capacitor unit may be identified. For example, the frequency at which the minimum impedance occurs may be determined from the responses 555 and 556 and compared to the frequency at which the minimum impedance occurs in the healthy frequency response 554.

Knowledge of the effect of a degradation or failure of one or more capacitor units in a particular one (or both) of the strings 534a, 534b on the impedance of the capacitor bank 520 and the frequency response of the capacitor bank 520 may be determined from configuration data (such as the impedance values of healthy capacitor units and the spatial arrangement of the capacitor units within the capacitor bank 520) that is stored on the electronic storage 158 (FIG. 1A0 of the monitoring system 150. Additionally, the effect of a degradation or failure may be known from prior physical measurements or simulations of the capacitor bank 520 under a variety of conditions. Additionally or alternatively, knowledge of the effect of the failure of a capacitor unit may come from an impedance-based model of the capacitor bank 520.

In some implementations, features other than or in addition to the frequency at which the minimum impedance occurs are extracted from the responses 555 and 556 and provided to a statistical classifier to identify which string 534a, 534b contains the failed or degraded capacitor unit or which capacitor unit has degraded or failed. For example, the features may include the frequencies of significant peaks and/or minima of the impedance magnitude response, the magnitude and/or phase of the impedance at the frequencies of maxima and/or minima of the impedance frequency response and the impedance magnitude and/or phase at low frequencies (for example, 10 kHz). The features may also include relative "difference" features with respect to the baseline healthy impedance response. For example, the difference of the peak and/or minima frequencies relative to the baseline, the difference of the impedance magnitude and/or phase at these frequencies relative to the baseline, and/or the difference in impedance magnitude and/or phase at low frequencies relative to the baseline may be used as features.

Thus, the frequency response of the capacitor bank 520 may be measured and compared to the baseline response 554 to identify a failed or degraded capacitor or a string that includes a failed or degraded capacitor.

In some implementations, the monitoring system 150 also may use an impedance-based model of the capacitor bank 520 to identify strings that include a failed or degraded capacitor unit. The capacitor bank 520 may be modeled using a lumped resistance (R), capacitance (C), and inductance (L) to represent each string 534a, 534b, with the parameters (R, L, C) representing the impedance of all of the capacitor units in a particular string. The values of (R, L, C) for each string 534a, 534b when the capacitor bank 520 only includes healthy capacitor units may be determined from the known nominal values of the components of the capacitor units.

Equation 1 may be used to model the impedance of the strings 534a, 534b bank 520 as a function of frequency:

$$Z(w) = \left(R_2 + jwL_2 + \frac{1}{jwC_2} + R_{11} + jwL_{11}\right) \| \left(R_1 + jwL_1 + \frac{1}{jwC_1}\right),$$ Equation (1)

where Z(w) is the modeled impedance of the capacitor bank 520 as a function of frequency, $R_1$, $L_1$, and $C_1$ are the lumped impedance parameters for the string 534a, and $R_2$, $L_2$, $C_2$ are the lumped impedance terms for the string 534b, $R_{11}$ is a resistance of a conductor 535 between the strings 534a and 534b, and $L_{11}$ is an inductance of the conductor 535 between the strings 534a and 534b.

To achieve more accurate models, the R, L and C parameters may be modeled as a function of frequency. More specifically, the resistance of the connecting wires and the capacitor equivalent series resistance as well as the inductance of the connecting wires and the capacitor equivalent series inductance can both modeled as frequency variable parameters. By combining the resistive and reactive parts of all string components, strings 534a and 534b can be modeled as follows:

$$Z(w) = \left(\frac{a1*w}{1+a2*w^\wedge 0.5} + j(a3*w + a4*w^\wedge 0.5) + \frac{1}{jwa5}\right),$$

where a1 and a2 are constants indicative of resistance, a3 and a4 represent the inductive reactance and a5 is indicative of string capacitance. These constants depend on the bank geometry, materials used and external conditions. The model can also incorporate terms associated with the impedance and error models of the measurement system.

A measured frequency response that deviates from the measured healthy frequency response 554 or from a modeled expected healthy frequency response of the bank 520 (determined from Equation 1) indicates that one or more of the strings 534a, 534b includes a failed or degraded capacitor unit. To identify the failed or degraded capacitor unit or the particular string that includes the failed or degraded capacitor unit, the measured frequency response may be compared to the healthy frequency response to determine an error function. The impedance parameters (R, L, C) that for each string 534a, 534b that produces an estimated frequency response most similar to the measured frequency response or to the determined error function are estimated. The impedance parameters (R, L, C) that produce the frequency response that is most similar may be determined through, for example, a non-linear optimization. The estimated impedance parameters (R, L, C) for each string 534a, 534b are compared to the healthy impedance parameters for that string. The string 534a, 534b that has estimated impedance parameters (R, L, C) that differ from the healthy impedance parameters (R, L, C) is identified as a string that contains a failed or degraded capacitor unit.

In some implementations, the capacitance values used in the impedance-based model of the capacitor bank 520 may be further refined by providing the frequency sweep input signal 552 to the capacitor bank 520 when all of the capacitor units 530 are known to be healthy to obtain a measured healthy frequency response of the capacitor bank 520. This measured healthy frequency response is compared to the modeled healthy frequency response. The modeled healthy frequency response is obtained by setting the RLC values of the impedance-based model to the nominal, healthy values for all components in the capacitor bank. If the RLC parameters used in the impedance-based model are the same as those in the actual capacitor bank 520, then the measured healthy frequency response and the modeled healthy frequency response are the same. However, if the responses are different, the values of the capacitance parameters of the model may be adjusted until the modeled healthy frequency response is the same as the measured healthy frequency response. In this manner, the parameters of the impedance-based model may be further refined or improved to more closely match the actual capacitor bank 520.

Thus, the monitoring system 150 may use the frequency response of the bank 520 to identify whether either or both of the strings 534a, 534b contain a failed or degraded capacitor unit and it may also indicate the severity level of the fault. The monitoring system 150 may identify a failed or degraded capacitor unit based on frequency response data measured from the capacitor bank 520 alone (a data-based approach) or based on measured data together with an impedance-based model of the capacitor bank 520.

Additionally, in some implementations, the time domain reflectometry (TDR) technique discussed in FIGS. 3A, 3B and 4A-4C is used with the impedance frequency response technique discussed in FIGS. 5A-5C and 6. In these implementations, a string that contains a failed or degraded capacitor unit is identified using the impedance-based model of the capacitor bank 520 and a measured frequency response of the capacitor bank, or from a measured baseline frequency response and a later-measured frequency response of the capacitor bank, and the monitoring system 150 provides the input signal 552 to the capacitor bank 520 to obtain a time domain reflection (TDR) response of the identified string. The TDR response of the identified string may be separated from the responses of other strings by, for example, applying a filter that blocks reflections from times not associated with one of the capacitor units in the identified string.

Thus, the TDR technique discussed above with respect to FIGS. 3A, 3B, and 4A-4D may be used with the impedance frequency response technique of FIGS. 5A-5C and 6. By localizing the failed capacitor unit to a particular string in the capacitor bank, the accuracy and speed of the TDR technique may be improved.

Other implementations are within the scope of the claims.

For example, in FIGS. 5A-5C, the monitoring system 150 provides the input signal 552 to and receives the frequency response from the capacitor bank 520 while the capacitor bank 520 is disconnected from a power line 108 with a switch 140 in the open position. In the example of FIGS. 3A and 3B, the monitoring system 150 provides the input signal 352 to and receives the TDR response from the capacitor bank 320 while the capacitor bank 320 is disconnected from a power line 108 with a switch 140 in the open position. However, the monitoring system 150 may be used while the capacitor bank 320 or the capacitor bank 520 are "on line" (connected to the power line 108 with the switch 140 in the closed position). In these implementations, filters may be placed between the monitoring system 150 and the power line 108 so that the electricity flowing in the power line 108 at the fundamental frequency of 50 or 60 Hz does not enter the monitoring system 150. In this manner, the monitoring system 150 may be used to monitor the capacitor bank 320 or the capacitor bank 520 while the banks are in operation, with the filters preventing signals other than the reflected TDR signal or the frequency response signal from entering the monitoring system 150.

Additionally, in the examples of FIGS. 1A, 1B, 3A and 3B, and 5A-5C, the monitoring system 150 provides an input signal through the terminal 124, 324, 524, respectively, and receives the output signal through the terminal 124, 324, 524, respectively. However, in other examples, the monitoring system 150 provides the input signal to the capacitor bank 120, 320, 520 at another location. A single measurement point (such as the terminal 124, 324, 524) may be located anywhere in or at the respective capacitor bank. Additionally, the input signal may be provided to the capacitor bank at a location on the capacitor bank that is different from the location where the output signal is received. Furthermore, more than one monitoring system 150 may be used on a single capacitor bank, with monitoring systems 150 being positioned to monitor groups of capacitor units within the capacitor bank 120, 320, 520. In implementations in which more than one monitoring system 150 is used, each monitoring system 150 receives an output signal that includes contributions of more than one capacitor unit or string of capacitor units and identifies a particular capacitor unit or a string of capacitor units from that output signal.

FIGS. 3A-3C show the capacitor bank 320 having two capacitor units 330a, 330b in series. However, the capacitor bank 320 may include more than two capacitor units, and the capacitor units may be arranged in series, in parallel, or in a configuration that includes series and parallel connections. Although FIGS. 5A-5C show two strings 534a and 534b, each having two capacitor units 530, the capacitor bank 520 may include more than two strings and each of the strings may include more than two capacitor units 530.

To determine whether one or more of the capacitor units have failed or degraded, the monitoring system 150 may provide the input signal 152 to the capacitor bank 120 or 220, the input signal 352 to the capacitor bank 320, or the input signal 552 to the capacitor bank 520 on a regular, scheduled basis, for example, daily, weekly, or any time the capacitor bank 520 is removed from service (when the switch 140 is opened), or the monitoring system 150 may be operated on demand, for example, in response to an operator's command. When the monitoring system 150 is used online (while the capacitor bank is connected to the power line 108), the monitoring system 150 may provide an input signal and receive an output signal from a capacitor bank on an ongoing or substantially continuous basis.

The monitoring system 150 may be incorporated in the capacitor bank 120, 220, 320, 520, for example, when the capacitor bank is constructed. In these examples, the monitoring system 150 and the capacitor bank may be incorporated into a single unit and enclosed in a housing. In some implementations, the monitoring system 150 is separate from the capacitor bank and may be electrically coupled to a capacitor bank that is already deployed in the power system 100.

The characteristics, such as nominal impedance, size, and internal construction of the capacitor units 130, 230, 330, and 530 in the capacitor banks 120, 220, 320, and 520, respectively, may all be the same or the characteristics of capacitor units may vary within a given capacitor bank.

What is claimed is:

1. A system for identifying one or more failed or degraded capacitor units in a capacitor bank that comprises a plurality of capacitor units, the system comprising:
    a capacitor bank configured to be electrically connected to an electrical power system, the capacitor bank comprising a terminal and a plurality of capacitor units arranged in a predetermined and spatially fixed configuration relative to each other, each of the capacitor units comprising at least one capacitive element and having a nominal impedance, the capacitor bank having a first electrical response when all of the capacitor units have the nominal impedance; and
    a monitoring system electrically connected to the capacitor bank, the monitoring system configured to locate one or more failed or degraded capacitor units in the capacitor bank while the capacitor bank is connected to the electrical power system, the monitoring system comprising one or more electronic processors, and a non-transitory computer-readable medium coupled to the one or more electronic processors, the medium comprising instructions that, when executed, cause the one or more electronic processors to:

access configuration data stored on the computer-readable medium, the configuration data comprising information that specifies the spatially fixed configuration of the plurality of capacitor units of the capacitor bank;

provide a test electrical signal to the capacitor bank, the test electrical signal configured to interact with each capacitor unit in the capacitor bank to produce a capacitor unit response for that capacitor unit;

measure a second electrical response of the capacitor bank after providing the test electrical signal to the capacitor bank, the second electrical response of the capacitor bank being based on the capacitor unit responses of all of the capacitor units in the capacitor bank;

compare the first electrical response of the capacitor bank and the second electrical response of the capacitor bank to determine an error signal, the error signal comprising features related to the capacitor unit response of each capacitor unit;

analyze the error signal to extract one or more of the features; and provide one or more of the extracted features to a classifier configured to determine, based on the provided extracted features and the information that specifies the spatially fixed configuration of the plurality of capacitor units of the capacitor bank, a location of a group of capacitor units within the capacitor bank that have degraded or failed, the group of capacitor units comprising fewer than all of the capacitor units in the capacitor bank.

2. The system of claim 1, wherein
the test electrical signal comprises a voltage signal,
the capacitor unit response for a capacitor unit comprises a reflection of the voltage signal, the reflection being reflected by that capacitor unit,
the second electrical response of the capacitor bank comprises an amplitude and phase of the reflection of the test electrical signal from all of the plurality of capacitor units of the capacitor bank as a function of time, and
the features related to the capacitor unit response of each capacitor unit comprise a time at which each reflection occurs.

3. The system of claim 2, wherein the group of capacitor units is a single one of the capacitor units.

4. The system of claim 2, wherein the capacitor bank is a fuseless capacitor bank.

5. The system of claim 1, wherein
the test electrical signal comprises a voltage signal that comprises a plurality of frequencies,
the test electrical signal has substantially the same voltage for each of the plurality of frequencies, and
the second electrical response of the capacitor bank comprises an impedance of the capacitor bank as a function of the plurality of frequencies.

6. The system of claim 1, wherein the capacitor bank comprises a fuseless capacitor bank, the second electrical response of the capacitor bank comprises an impedance of the capacitor bank as a function of frequency, and the group of capacitor units comprises a string of capacitor units connected in series.

7. The system of claim 1, wherein the second electrical response of the capacitor bank comprises an impedance of the capacitor bank as a function of frequency, and the group of capacitor units comprises a single one of the capacitor units.

8. The system of claim 1, wherein the instructions to compare the first electrical response and the second electrical response comprise instructions to subtract the first electrical response and the second electrical response to form the error signal.

9. The system of claim 1, further comprising instructions to cause the processor to:

generate a modeled electrical response from an impedance-based model of the capacitor bank, the impedance-based model of the capacitor bank being based on the nominal values of the capacitor units and the configuration data; and store the modeled electrical response in the computer-readable medium, wherein
the first electrical response of the capacitor bank comprises the modeled electrical response, and
the instructions to compare the first electrical response and the second electrical response comprise instructions to subtract the modeled electrical response and the second electrical response to form the error signal.

10. The system of claim 9, further comprising instructions to cause the processor to adjust one or more parameters of the impedance-based model based model after forming the error signal and to generate a second modeled electrical response from the adjusted impedance-based model.

11. The system of claim 1, further comprising a communications interface coupled to the monitoring system, the communications interface configured to provide an indication of the group of capacitor units to a remote station.

12. The system of claim 1, wherein the test electrical signal is provided to the capacitor bank through the terminal, and the second electrical response of the capacitor bank is measured at the terminal after providing the test electrical signal to the capacitor bank.

13. The system of claim 1, wherein the capacitor bank comprises an internally fused capacitor bank or an externally fused capacitor bank.

14. The system of claim 1, wherein the classifier comprises a statistical classifier or a neural network.

15. The system of claim 1, wherein the one or more extracted features comprise any of: a magnitude of the error signal at a time relative to a time when the test electrical signal was provided to the capacitor bank, a time associated with an expected reflection from a capacitor unit known based on the configuration data, a phase at a relative time associated with a location of capacitor unit known based on the configuration data, a time duration of a reflection of the test electrical signal from the capacitor bank, and a starting time of a reflection of the test electrical signal from the capacitor bank.

16. The system of claim 1, wherein
each of the first electrical response and the second electrical response comprise a value related to a magnitude or phase of the impedance of the capacitor bank at each of a plurality of different frequencies, and
the one or more extracted features comprise any of a frequency at which a maximum value occurs, a frequency at which a minimum value occurs, and a value of a magnitude or phase of the impedance at a frequency below 10 kiloHertz (kHz).

17. The system of claim 1, wherein the information that specifies the spatially fixed configuration of the plurality of capacitors units of the capacitor bank comprises one or more of: a spatial arrangement of the capacitor units within the capacitor bank relative to each other, a length of an electrical connection between any two capacitor units, and a type of electrical connection between any two capacitor units.

18. The system of claim 1, wherein the first electrical response of the capacitor bank is stored on the computer-readable medium before the second electrical response of the capacitor bank is measured.

19. A method of monitoring a capacitor bank to identify one or more failed or degraded capacitor units in the capacitor bank, the method comprising:
providing a test electrical signal to a capacitor bank, the capacitor bank comprising a plurality of capacitor units arranged in a fixed spatial relationship with each other, the test electrical signal being configured to interact with each capacitor unit to produce a capacitor unit response for that capacitor unit, each capacitor unit having a nominal impedance, and the capacitor bank having a first electrical response when all of the capacitor units have the nominal impedance;
measuring a second electrical response of the capacitor bank after providing the test electrical signal to the capacitor bank, the second electrical response of the capacitor bank being based on the capacitor unit responses of all of the capacitor units in the capacitor bank;
comparing a first electrical response of the capacitor bank and the second electrical response of the capacitor bank to determine an error signal;
analyzing the error signal to extract one or more features related to the capacitor units;
accessing information that indicates a spatial arrangement of the capacitor units of the capacitor bank; and
providing the one or more of the extracted features to a classifier configured to determine whether one or more capacitor units in the capacitor bank are failed or degraded, wherein
the classifier is configured to determine whether the one or more capacitor units within the capacitor bank are failed or degraded based on one or more of the extracted features and the information that indicates the spatial arrangement of the capacitor units.

20. The method of claim 19, wherein
the first electrical response comprises an amplitude and phase of a reflection of a first electrical signal from the capacitor units of the capacitor bank as a function of time, and
the second electrical response comprises an amplitude and phase of a reflection of the test electrical signal from capacitor units of the capacitor bank as a function of time.

21. The method of claim 20, further comprising providing a first electrical signal to the capacitor bank before providing the test signal to the capacitor bank; and obtaining the first electrical response by measuring the response of the capacitor bank to the first electrical signal.

22. The method of claim 19, wherein comparing the first electrical response and the second electrical response to determine an error signal comprises determining a difference between the first electrical response and the second electrical response.

23. The method of claim 19, wherein
the capacitor bank comprises a plurality of strings, each string comprising a plurality of capacitor units connected in series, and
determining whether one or more capacitor units in the capacitor bank are degraded or failed comprises identifying the one or more capacitor units within the capacitor bank that have a changed impedance comprises identifying a string from among the plurality of strings.

24. The method of claim 19, further comprising providing an indication of one or more failed or degraded capacitor units to a remote monitoring station.

25. The method of claim 19, wherein the test electrical signal is provided to the capacitor bank at a terminal of the capacitor bank, and the second response of the capacitor bank is measured at the terminal.

26. The method of claim 19, wherein the classifier comprises a statistical classifier or a neural network.

27. A system for locating one or more failed or degraded capacitor units in a capacitor bank, the system comprising:
a monitoring system configured to connect to the capacitor bank, the capacitor bank comprising a plurality of capacitor units arranged in a spatially fixed configuration, and the monitoring system comprising:
one or more electronic processors, and a non-transitory computer-readable medium coupled to the one or more electronic processors, the medium comprising instructions that, when executed, cause the one or more electronic processors to:
access configuration data stored on the computer-readable medium, the configuration data comprising information that specifies the spatial configuration of the capacitor units in the capacitor bank, the spatial configuration indicating a predetermined and spatially fixed arrangement of the capacitor units relative to each other and a nominal impedance of each capacitor unit;
provide a test electrical signal to the capacitor bank, the test electrical signal being configured to interact with the capacitor units to produce a capacitor unit response for each capacitor unit;
measure a second electrical response of the capacitor bank after providing the test electrical signal to the capacitor bank, the second electrical response being based on the capacitor unit responses of all of the capacitor units in the capacitor bank;
compare a first electrical response of the capacitor bank and the second electrical response of the capacitor bank to determine an error signal;
analyze the error signal to extract one or more features; and
provide one or more of the extracted features to a classifier configured to locate, based on the one or more features and the information that specifies the spatially fixed configuration of the plurality of capacitor units of the capacitor bank, a group of capacitor units within the capacitor bank that are degraded or failed, the group of capacitor units comprising fewer than all of the capacitor units in the capacitor bank.

* * * * *